(12) United States Patent
Wang et al.

(10) Patent No.: US 7,973,553 B1
(45) Date of Patent: Jul. 5, 2011

(54) TECHNIQUES FOR ON-CHIP TERMINATION

(75) Inventors: Xiaobao Wang, Cupertino, CA (US);
Chiakang Sung, Milpitas, CA (US);
Bonnie I. Wang, Cupertino, CA (US);
Khai Nguyen, San Jose, CA (US); John Henry Bui, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/721,759

(22) Filed: Mar. 11, 2010

(51) Int. Cl.
*H03K 17/16* (2006.01)
*H03K 19/003* (2006.01)

(52) U.S. Cl. .............................. 326/30; 326/34; 326/87

(58) Field of Classification Search .................. 326/30, 326/32–34, 87; 327/108, 112
See application file for complete search history.

(56) References Cited

U.S. PATENT DOCUMENTS

| | | | |
|---|---|---|---|
| 6,064,224 A | 5/2000 | Esch, Jr. et al. | |
| 6,445,245 B1 | 9/2002 | Schultz et al. | |
| 7,038,486 B2 * | 5/2006 | Aoyama et al. | 326/30 |
| 7,218,155 B1 | 5/2007 | Chang et al. | |
| 7,221,193 B1 | 5/2007 | Wang et al. | |
| 7,417,452 B1 | 8/2008 | Wang et al. | |
| 7,420,386 B2 | 9/2008 | Wang et al. | |
| 7,443,203 B2 * | 10/2008 | Oguri | 326/83 |
| 2006/0226868 A1 * | 10/2006 | Lee et al. | 326/30 |
| 2009/0167344 A1 * | 7/2009 | Lee | 326/30 |
| 2010/0045338 A1 * | 2/2010 | Kodato | 326/30 |

* cited by examiner

*Primary Examiner* — Anh Q Tran
(74) *Attorney, Agent, or Firm* — Steven J. Cahill

(57) ABSTRACT

A circuit includes first transistors and a comparator. The comparator compares a reference signal and a signal that is based on conductive states of the first transistors. A control circuit generates first control signals based on an output signal of the comparator. The conductive states of the first transistors are determined based on the first control signals. An arithmetic circuit performs an arithmetic function based on the first control signals and second control signals to generate calibration signals. Second transistors provide a termination impedance at an external terminal of the circuit that is based on the calibration signals.

21 Claims, 4 Drawing Sheets

TECHNIQUES FOR ON-CHIP TERMINATION

BACKGROUND

The present invention relates to electronic circuits, and more particularly, to techniques for on-chip termination on electronic circuits.

When transmitting signals over distances that are appreciable with respect to the signal period, mismatches between the impedance of the transmission line and that of the receiver may cause signal reflection. The reflected signal interferes with the transmitted signal and causes distortion and degrades the overall signal integrity. To minimize or eliminate the unwanted reflection, transmission lines are resistively terminated by a matching impedance. In the case of integrated circuits that are in communication with other circuitry on a circuit board, termination is often accomplished by coupling an external termination resistor to the relevant input/output (I/O) pins.

For many high speed integrated circuits, and particularly those that have large I/O pin counts, external termination poses a number of problems. A termination resistor is typically coupled to every I/O pin receiving an input signal from a transmission line. Often hundreds of termination resistors are needed for an integrated circuit. Numerous external termination resistors can consume a substantial amount of board space. The use of external components for termination purposes can be cumbersome and costly, especially in the case of an integrated circuit with numerous I/O pins.

Signal integrity is crucial in digital design. To improve signal integrity, both single-ended and differential signals are terminated. Termination can be implemented with external termination resistors on a board or with on-chip termination technology. On-chip termination eliminates the need for external resistors and simplifies the design of a circuit board. It is therefore desirable to implement the termination resistance on-chip to reduce the number of external components.

BRIEF SUMMARY

According to some embodiments, a circuit includes first transistors and a comparator. The comparator compares a reference signal and a signal that is based on conductive states of the first transistors. A control circuit generates first control signals based on an output signal of the comparator. The conductive states of the first transistors are determined based on the first control signals. An arithmetic circuit performs an arithmetic function based on the first control signals and second control signals to generate calibration signals. Second transistors provide a termination impedance at an external terminal of the circuit that is based on the calibration signals.

According to other embodiments, a circuit includes a calibration circuit and a buffer circuit. The calibration circuit includes first transistors, a comparator that compares a reference signal and a signal that is based on conductive states of the first transistors, and a control circuit generating control signals that are based on an output signal of the comparator. The conductive states of the first transistors are determined based on the control signals. The buffer circuit includes storage circuits that store calibration signals having values that are based on the control signals in response to an update signal, and second transistors that provide a termination impedance at a pin that is based on the calibration signals.

Various objects, features, and advantages of the present invention will become apparent upon consideration of the following detailed description and the accompanying drawings.

DETAILED DESCRIPTION

Figure 1:
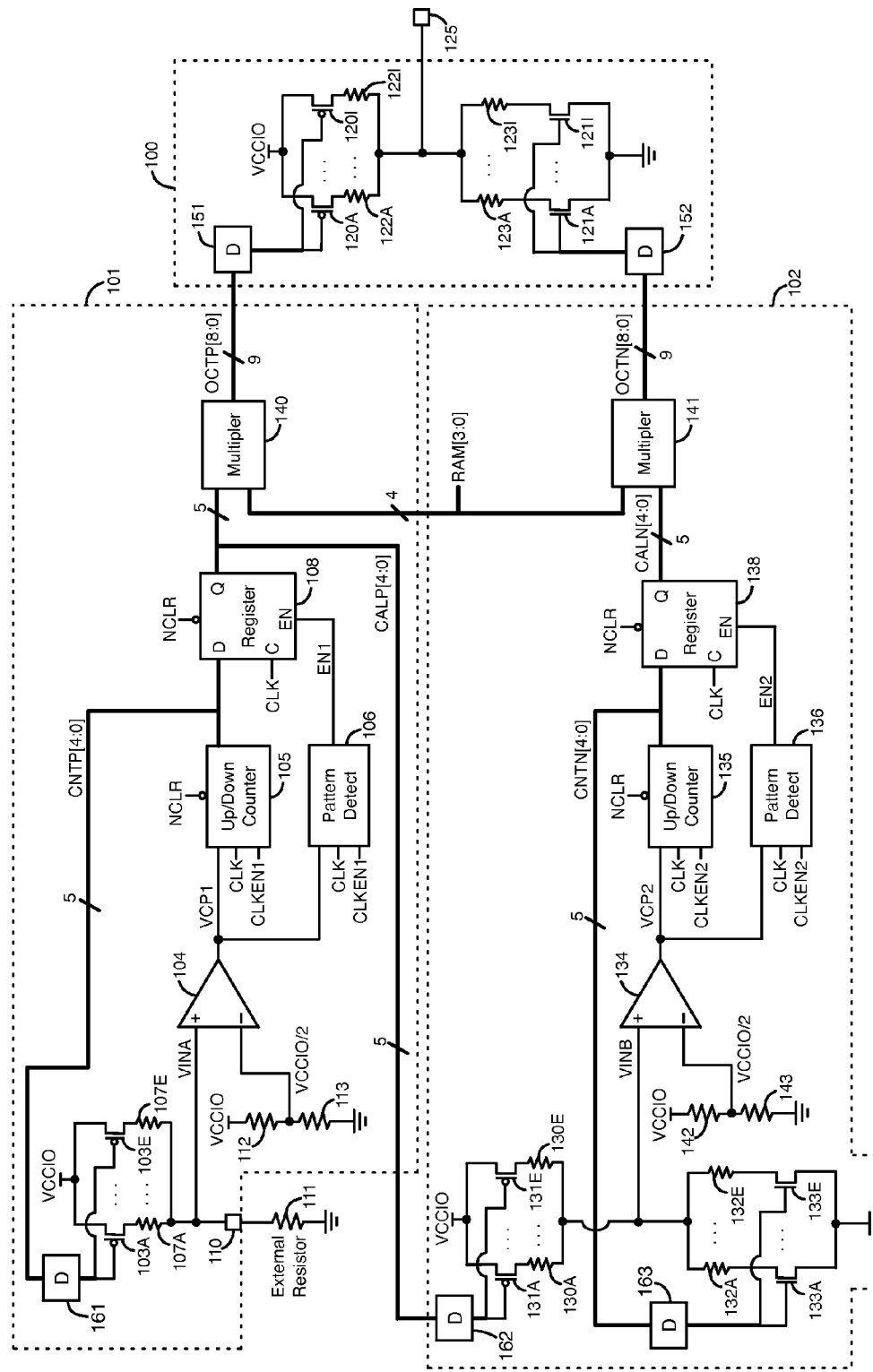
FIG. 1 illustrates a PMOS calibration circuit and an NMOS calibration circuit, according to embodiments of the present invention.

FIG. 1 illustrates a PMOS calibration circuit 101 and an NMOS calibration circuit 102, according to embodiments of the present invention. PMOS calibration circuit 101 controls the on-chip termination (OCT) impedance of 9 pull-up p-channel metal oxide semiconductor (i.e., PMOS) field-effect transistors 120A-120I in input/output (IO) buffer 100. NMOS calibration circuit 102 controls the on-chip termination impedance of 9 pull-down n-channel MOS (i.e., NMOS) field-effect transistors 121A-121I in IO buffer 100. Transistors 120A-120I are also collectively referred to herein as transistors 120, and transistors 121A-121I are also collectively referred to herein as transistors 121. The circuitry shown in FIG. 1 is typically formed in an integrated circuit (IC).

IO buffer 100 can be configured to function as an output buffer. If IO buffer 100 is configured as an output buffer, transistors 120-121 drive output signals (e.g., output data signals) generated in the IC to external terminal pin 125, and transistors 120-121 provide series termination impedance to the output signals driven to pin 125. Calibration circuits 101-102 can vary the termination impedance provided by transistors 120-121 at pin 125 by changing the number of transistors 120-121 that are enabled and disabled. IO buffer 100 only turns the enabled transistors 120-121 on and off to drive output signals to pin 125. The disabled transistors 120-121 remain off and do not drive output signals to pin 125. When IO buffer 100 is configured as an output buffer, the enabled transistors 120 are turned on and all of transistors 121 are turned off to drive a logic high signal to pin 125. Also, when IO buffer 100 is configured as an output buffer, all of transistors 120 are turned off and the enabled transistors 121 are turned on to drive a logic low signal to pin 125.

Alternatively, input signals from outside the integrated circuit (IC) can be driven through pin 125 to a receiving input buffer circuit (not shown) on the IC. If input signals are driven from outside the IC through pin 125, transistors 120-121 can be configured to provide parallel termination impedance to the input signals received at pin 125. Transistors 120-121 can provide parallel termination impedance at pin 125, for example, by turning at least one of transistors 120 and at least one of transistors 121 on at the same time to form a Thevenin equivalent impedance. Calibration circuits 101-102 can change the number of transistors 120-121 that are turned on concurrently to vary the parallel termination impedance at pin 125.

Transistors 120 and transistors 121 may have binary-weighted width-to-length channel ratios. Driver circuits 151 control the gate voltages of transistors 120A-120I based on the logic states of calibration signals OCTP[8:0]. Driver circuits 152 control the gate voltages of transistors 121A-121I based on the logic states of calibration signals OCTN[8:0].

The total drive current strength provided to pin 125 equals the sum of the transistor currents in buffer 100. The impedance of buffer 100 is inversely proportional to the driver strength.

Nine resistors 122A-122I are coupled in series with 9 transistors 120A-120I, respectively. Resistors 122A-122I increase the linearity of the current response of transistors 120A-120I. The resistance ratio between resistors 122A-122I and transistors 120A-120I, respectively, can be, for example, 30% for each resistor 122 and 70% for each transistor 120 that it is coupled to.

Nine resistors 123A-123I are coupled in series with 9 transistors 121A-121I, respectively. Resistors 123A-123I increase the linearity of the current response of transistors 121A-121I. The resistance ratio between resistors 123A-123I and transistors 121A-121I, respectively, can be, for example, 30% for each resistor 123 and 70% for each transistor 121 that it is coupled to.

PMOS calibration circuit 101 has a calibration pin 110 that is an external terminal of the IC. A user can couple an external resistor 111 to pin 110 to select the on-chip termination resistance for pull-up PMOS transistors 120 and for pull-down NMOS transistors 121. NMOS calibration circuit 102 does not have a pin that is an external terminal for coupling to an external resistor.

PMOS calibration circuit 101 has 5 PMOS transistors 103A-103E that are coupled to receive a constant supply voltage VCCIO. PMOS transistors 103A-103E may have binary weighted channel width-to-length ratios. PMOS calibration circuit 101 also has 5 resistors 107A-107E that are coupled in series with transistors 103A-103E, respectively. Resistors 107A-107E are added to cause transistors 103A-103E to have a current response that matches transistors 120A-120I.

Resistors 107A-107E are coupled to pin 110. Transistors 103A-103E, resistors 107A-107E, and external resistor 111 form a resistor divider. The non-inverting (+) input of comparator circuit 104 is coupled to this resistor divider at pin 110. Comparator 104 receives a divided voltage VINA from the resistor divider at its non-inverting input.

The resistances of transistors 103A-103E, resistors 107A-107E, and resistor 111 control the voltage VINA. The effective resistance of transistors 103A-103E can be varied by turning on and off different combinations of these transistors. Voltage VINA varies in response to turning on and off different combinations of transistors 103A-103E.

The inverting input (−) of comparator 104 receives a reference voltage VCCIO/2 that equals one-half of the supply voltage VCCIO. The reference voltage VCCIO/2 is generated by resistors 112 and 113. The output of comparator 104 is coupled to an up/down input of 5-bit up/down counter circuit 105 and to an input of pattern detect circuit 106. Counter 105 generates 5 digital count signals CNTP[4:0] at its outputs.

When the voltage VINA at the non-inverting input of comparator 104 is less than the voltage VCCIO/2 at the inverting input of comparator 104, the output voltage VCP1 of comparator 104 is in a logic low state. Counter 105 causes the digital binary value of count signals CNTP[4:0] to increase by one in each period of clock signal CLK when the output voltage VCP1 of comparator 104 is in a logic low state. Driver circuits 161 control the gate voltages of transistors 103A-103E based on the logic states of the count signals CNTP[4:0]. Driver circuits 161 invert the logic states of the CNTP[4:0] signals to generate inverted signals that are used to drive the gates of PMOS transistors 103A-103E. The effective resistance of PMOS transistors 103A-103E decreases in response to the binary value of the count signals CNTP[4:0] increasing.

If the voltage VINA at the non-inverting input of comparator 104 exceeds voltage VCCIO/2, the output voltage VCP1 of comparator 104 is in a logic high state. Counter 105 causes the digital binary value of count signals CNTP[4:0] to decrease by one in each period of CLK when the output voltage VCP1 of comparator 104 is in a logic high state. The effective resistance of PMOS transistors 103A-103E increases in response to the binary value of count signals CNTP[4:0] decreasing.

The voltage VINA at the non-inverting input of comparator 104 increases until VINA rises above VCCIO/2. After VINA initially rises above VCCIO/2, the calibration becomes stable, and voltage VINA oscillates across the VCCIO/2 voltage threshold. When voltage VINA oscillates around VCCIO/2, the effective resistance of transistors 103A-103E and resistors 107A-107E has come as close to the resistance of external resistor 111 as calibration circuit 101 can get it.

Pattern detect circuit 106 in calibration circuit 101 monitors the output voltage VCP1 of comparator 104. Pattern detect circuit 106 detects the toggling output voltage VCP1 of comparator 104 and enables register 108 to latch the values of count signals CNTP[4:0]. When the output voltage VCP1 of comparator 104 toggles between high and low logic states, the output voltage EN1 of pattern detect circuit 106 transitions to a logic high state.

For example, pattern detect circuit 106 may assert the EN1 signal to a logic high state in response to at least three logic high-to-low or logic low-to-high transitions in the output voltage VCP1 of comparator 104, indicating that VINA is oscillating above and below VCCIO/2. Further details of pattern detect circuit 106 are described in commonly-assigned U.S. Pat. No. 7,221,193, issued May 22, 2007, to Wang et al, which is incorporated by reference herein.

The output of circuit 106 is coupled to the enable input EN of register 108. Register 108 is enabled in response to a logic high state in the output signal EN1 of circuit 106. Register 108 includes 5 serially coupled flip-flops. The count signals CNTP[4:0] are transmitted to the D inputs of register 108. Register 108 stores the 5 count signals CNTP[4:0] at its Q outputs as 5 calibration signals CALP[4:0] in response to a rising edge of clock signal CLK and a logic high pulse in signal EN1.

Driver circuits 162 control the gate voltages of 5 PMOS transistors 131A-131E based on the logic states of the calibration signals CALP[4:0]. Driver circuits 162 invert the logic states of the CALP[4:0] signals to generate inverted signals that are used to drive the gates of PMOS transistors 131A-131E. PMOS transistors 131A-131E are coupled to receive supply voltage VCCIO. PMOS transistors 131A-131E are coupled in series with 5 resistors 130A-130E, respectively. Resistors 130A-130E are added to cause transistors 131A-131E to have a current response that matches transistors 120A-120I. Resistors 130A-130E are coupled to the non-inverting (+) input of comparator circuit 134.

5 NMOS transistors 133A-133E are coupled to a ground terminal. Transistors 133A-133E are coupled in series with 5 resistors 132A-132E, respectively. Resistors 132A-132E are added to cause transistors 133A-133E to have a current response that matches transistors 121A-121I. Transistors 131A-131E, resistors 130A-130E, transistors 133A-133E, and resistors 132A-132E generate a voltage VINB at the non-inverting (+) input of comparator circuit 134. Resistors 142-143 generate a voltage VCCIO/2 at the inverting (−) input of comparator 134 that equals one-half of the supply voltage VCCIO.

If the voltage VINB at the non-inverting input of comparator 134 is greater than the voltage VCCIO/2 at the inverting input of comparator 134, the output voltage VCP2 of comparator 134 is in a logic high state. When the output voltage VCP2 of comparator 134 is high, 5-bit up/down counter circuit 135 increases the binary value of its 5 output count signals CNTN[4:0] by one in each period of CLK. Driver circuits 163 control the gate voltages of NMOS transistors 133A-133E based on the logic states of the count signals CNTN[4:0]. When the binary value of count signals CNTN[4:0] increases, the effective resistance of NMOS transistors 133A-133E decreases.

If the voltage VINB at the non-inverting input of comparator 134 is less than the voltage VCCIO/2 at the inverting input of comparator 134, the output voltage VCP2 of comparator 134 is in a logic low state. When the output voltage VCP2 of comparator 134 is low, up/down counter circuit 135 decreases the binary value of count signals CNTN[4:0] by one in each period of CLK, causing the effective resistance of NMOS transistors 133A-133E to increase.

The voltage VINB eventually oscillates across the VCCIO/2 voltage threshold as discussed above with respect to PMOS calibration circuit 101. Pattern detect circuit 136 monitors the output voltage VCP2 of comparator 134. When pattern detect circuit 136 detects the toggling output voltage of comparator 134, pattern detect circuit 136 drives its output signal EN2 to a logic high state. Further details of pattern detect circuit 136 are described in U.S. Pat. No. 7,221,193.

Register 138 is enabled when EN2 rises to a logic high state. Register 138 includes 5 serially coupled flip-flops. The count signals CNTN[4:0] are transmitted to the D inputs of register 138. Register 138 stores the values of the count signals CNTN[4:0] at its Q outputs as calibration signals CALN[4:0] in response to a logic high pulse in EN2 and a rising edge in CLK. Calibration circuits 101-102 are then finished with the calibration process, and the values of CALP[4:0] and CALN[4:0] represent newly calibrated on-chip termination control signal values.

Signal NCLR is used to clear the calibration signals CALP[4:0] and CALN[4:0] to logic low states. Signal CLKEN1 enables counter 105 and pattern detect circuit 106. Signal CLKEN2 enables counter 135 and pattern detect circuit 136.

PMOS calibration circuit 101 initially uses external resistor 111 to calibrate PMOS pull-up transistors 103A-103E. The calibration code value CALP[4:0] selected to control PMOS transistors 103A-103E is then used to control PMOS pull-up transistors 131A-131E. Subsequently, NMOS calibration circuit 102 calibrates NMOS pull-down transistors 133A-133E using the already calibrated PMOS transistors 131A-131E as references. The resistance of reference resistor 111 can be increased to reduce power consumption. For example, the resistance of resistor 111 can be increased from 50 Ohms to 240 Ohms to reduce power consumption by 80%.

The calibration signals CALP[4:0] are transmitted to inputs of multiplier circuit 140. The calibration signals CALN[4:0] are transmitted to inputs of multiplier circuit 141. 4 signals RAM[3:0] are transmitted to inputs of each of multiplier circuits 140-141. The RAM[3:0] signals can be generated, for example, by other circuitry on the IC or driven into the IC from an external source through input pins. Multiplier circuit 140 multiplies the binary value of signals CALP[4:0] by the binary value of signals RAM[3:0] to generate a binary value for 9 PMOS calibration signals OCTP[8:0]. Multiplier circuit 141 multiplies the binary value of signals CALN[4:0] by the binary value of signals RAM[3:0] to generate a binary value for 9 NMOS calibration signals OCTN[8:0].

OCT calibration signals OCTP[8:0] and OCTN[8:0] are transmitted to IO buffer 100. Driver circuits 151 control the gate voltages of PMOS transistors 120A-120I based on the logic states of OCT calibration signals OCTP[8:0]. Driver circuits 151 invert the logic states of the OCTP[8:0] signals to generate inverted signals that are used to enable the gates of PMOS transistors 120A-120I. When buffer 100 is configured as an output buffer, calibration signals OCTP[8:0] determine which of transistors 120A-120I are enabled to be turned on and off by driver circuits 151 in response to a digital output signal that is driven to pin 125. Driver circuits 152 control the gate voltages of NMOS transistors 121A-121I based on the logic states of OCT calibration signals OCTN[8:0]. When buffer 100 is configured as an output buffer, calibration signals OCTN[8:0] determine which of transistors 121A-121I are enabled to be turned on and off by driver circuits 152 in response to a digital output signal that is driven to pin 125.

Calibration signals OCTP[8:0] determine which of transistors 120A-120I are on and which of transistors 120A-120I are off when buffer 100 is configured to provide parallel termination impedance at pin 125. Calibration signals OCTN[8:0] determine which of transistors 121A-121I are on and which of transistors 121A-121I are off when buffer 100 is configured to provide parallel termination impedance at pin 125. Pin 125 is an external terminal of the IC.

The OCTP[8:0] and the OCTN[8:0] calibration signals can be used to control the termination resistance of multiple IO buffers that are coupled to multiple pins. For example, the OCTP[8:0] and the OCTN[8:0] signals can control the series and/or parallel termination resistance at input/output pins in one or more banks of input/output buffers on an integrated circuit.

Multipliers 140 and 141 allow the logic states of the OCT calibration signals OCTP[8:0] and OCTN[8:0] to be changed by varying the logic states of the RAM[3:0] signals without changing the resistance of external resistor 111. When the binary value of the RAM[3:0] signals equals 1, the net resistance of transistors 120A-120I equals the resistance of resistor 111, and the net resistance of transistors 121A-121I equals the resistance of resistor 111. For example, if external resistor 111 equals 240 Ohms, and the binary value of signals RAM[3:0] equals 1, calibration circuit 101 causes transistors 120A-120I to have an effective resistance of about 240 Ohms, and calibration circuit 102 causes transistors 121A-121I to have an effective resistance of about 240 Ohms.

The binary value of the RAM[3:0] signals can be increased to an integer value greater than 1 to decrease the net resistances of transistors 120A-120I and transistors 121A-121I without changing the resistance of resistor 111. The net resistance of transistors 120A-120I equals the resistance of resistor 111 divided by the binary value of signals RAM[3:0]. The net resistance of transistors 121A-121I also equals the resistance of resistor 111 divided by the binary value of signals RAM[3:0].

Calibration circuits 101-102 only have one pin 110 and one external calibration resistor 111. Thus, the circuitry of FIG. 1 reduces the pin count on the integrated circuit and the number of external resistors. In conventional on-chip termination calibration circuits, the PMOS and NMOS calibration circuits together have two pins coupled to two external resistors. An integrated circuit that employs the techniques of FIG. 1 has one less pin and one less external resistor for each set of calibration circuits 101-102. By using only one pin 110 and one external resistor 111, the circuitry of FIG. 1 is compatible with the industry standards of many memory device vendors.

Calibration circuits 101-102 can be used to calibrate the termination impedance of IO buffer 100 when the IC is powering up and during the user mode of the IC. In power up mode, calibration circuits 101-102 calibrate the on-chip termination impedance in IO buffer 100 (and in other IO buffers on the IC) to compensate for variations in the process, supply voltage, and temperature of the IC. Because the supply voltage and the ambient temperature usually shift after the IC is powered up causing the termination impedance of IO buffer 100 to shift significantly (e.g., up to 20%), it is desirable to continue calibrating the on-chip termination impedance in user mode.

Typically, the OCT calibration circuits and the IO buffers are separated by a few thousand microns on the IC. As a result, skews may occur between the output calibration signals of the OCT calibration circuits that are caused by delays between when the calibration signals update and when the updated values of the calibration signals propagate to the IO buffers. The skews may, for example, be in the range of a few hundred picoseconds, which can cause the termination impedance of the IO buffers to vary significantly during the OCT updating process.

For example, if IO buffer 100 is sending signals to an external device through pin 125 with 50 Ohms of series termination resistance, a temperature shift can cause calibration circuits 101-102 to update each set of calibration signals OCTP[8:0] and OCTN[8:0] from 000010000 to 000001111. When the updated values of the calibration signals propagate from calibration circuits 101-102 to IO buffer 100, the calibration signals OCTP[8:0] or OCTN[8:0] may change from 000010000 to 000000000 to 000001111 as a result of skew between the calibration signals. IO buffer 100 is tri-stated at calibration values of 000000000, potentially causing a functional failure.

Figure 2:
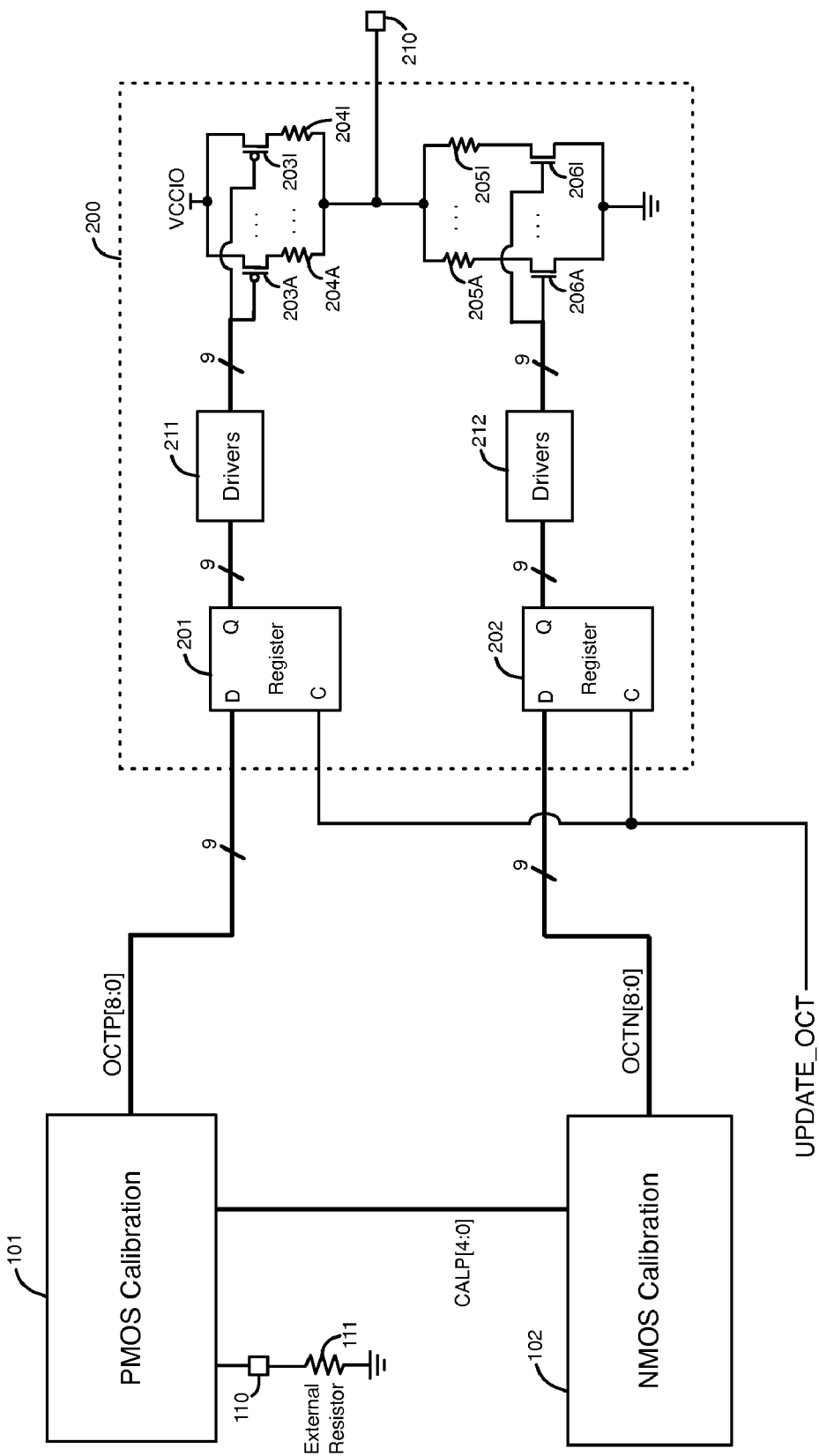
FIG. 2 illustrates an example of circuitry that can control when the on-chip termination impedance in an input/output buffer is updated, according to an embodiment of the present invention.

FIG. 2 illustrates an example of circuitry that can control when the on-chip termination impedance in an input/output buffer is updated, according to an embodiment of the present invention. In the embodiment of FIG. 2, calibration circuits 101-102 control the on-chip termination impedance provided by IO buffer 200 to signals at pin 210. IO buffer 200 includes registers 201, registers 202, driver circuits 211, driver circuits 212, 9 PMOS transistors 203A-203I, 9 resistors 204A-204I, 9 NMOS transistors 206A-206I, and 9 resistors 205A-205I.

PMOS transistors 203A-203I are coupled in series with resistors 204A-204I, respectively. NMOS transistors 206A-206I are coupled in series with resistors 205A-205I, respectively. Resistors 204A-204I and 205A-205I are coupled to pin 210.

Driver circuits 211 control the gate voltages of transistors 203A-203I. Driver circuits 212 control the gate voltages of transistors 206A-206I. As described above with respect to IO buffer 100, IO buffer 200 can be configured to function as an output buffer. If IO buffer 200 is configured as an output buffer, one or more of transistors 203A-203I and one or more of transistors 206A-206I are enabled to provide termination impedance to output signals at pin 210. IO buffer 200 can also be configured to provide parallel termination impedance for input signals received at pin 210, for example, by turning on one or more of transistors 203A-203I and one or more of transistors 206A-206I at the same time.

The calibration signals OCTP[8:0] generated by calibration circuit 101 are transmitted to the D inputs of registers 201. The calibration signals OCTN[8:0] generated by calibration circuit 102 are transmitted to the D inputs of registers 202. An UPDATE_OCT signal is transmitted to the C inputs of registers 201 and 202. In response to the UPDATE_OCT signal being driven to a logic high state, registers 201 store the logic states of the OCTP[8:0] signals at their Q outputs, and registers 202 store the logic states of the OCTN[8:0] signals at their Q outputs. The output signals of registers 201 equal the calibration signals OCTP[8:0] and the output signals of registers 202 equal calibration signals OCTN[8:0] just after the UPDATE_OCT signal is driven to a logic high state.

Driver circuits 211 turn on one or more of the PMOS transistors 203A-203I based on the logic states of the output signals of registers 201. Driver circuits 212 turn on one or more of the NMOS transistors 206A-206I based on the logic states of the output signals of registers 202. For example, each calibration signal that is in a logic high state may cause the driver circuits to turn on one of the corresponding transistors in buffer 200, and each calibration signal that is in a logic low state may cause the driver circuits to turn off one of the corresponding transistors in buffer 200.

Registers 201-202 only store the values of the calibration signals OCTP[8:0] and OCTN[8:0] in response to a rising edge in the UPDATE_OCT signal. All 18 of the calibration signals stored at the Q outputs of registers 201-202 are updated at the same time after registers 201-202 receive a rising edge in UPDATE_OCT. The length of the paths between the Q outputs of registers 201-202 and the gates of transistors 203A-203I and 206A-206I is too short to cause a significant amount of skew between the calibration signals. Registers 201-202 prevent skew between the calibration signals OCTP[8:0] and OCTN[8:0] that originates at calibration circuits 101-102 from propagating to driver circuits 211-212 and causing un-calibrated conductive states in transistors 203A-203I and 206A-206I.

The UPDATE_OCT signal is driven to a logic high state each time that the termination impedance in IO buffer 200 needs to be recalibrated. The circuitry of FIG. 2 provides the benefit of allowing the termination impedance of IO buffer 200 to be updated during the user mode of the IC by asserting the UPDATE_OCT signal without causing false termination values at pin 210. The UPDATE_OCT signal can be generated by other circuitry in the IC (e.g., programmable logic), or the UPDATE_OCT signal can be driven into the IC from an external source through an input pin.

Figure 3:
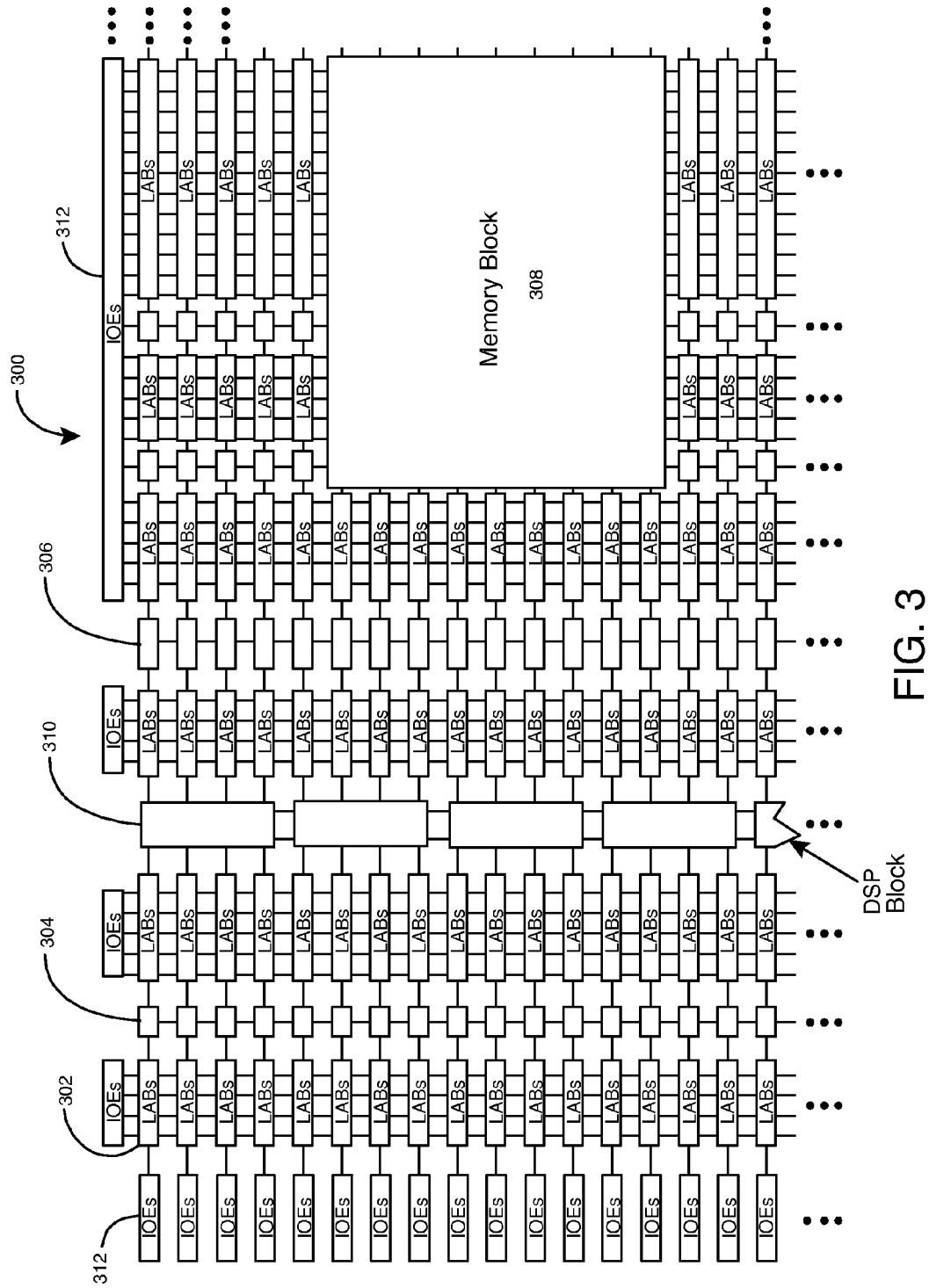
FIG. 3 is a simplified partial block diagram of a field programmable gate array (FPGA) that can include aspects of the present invention.

FIG. 3 is a simplified partial block diagram of a field programmable gate array (FPGA) 300 that can include aspects of the present invention. FPGA 300 is merely one example of an integrated circuit that can include features of the present invention. It should be understood that embodiments of the present invention described herein can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, controller integrated circuits, etc.

FPGA 300 includes a two-dimensional array of programmable logic array blocks (or LABs) 302 that are interconnected by a network of column and row interconnect conductors of varying length and speed. LABs 302 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including random access memory (RAM) blocks of varying sizes provided throughout the array. The RAM blocks include, for example, blocks 304, blocks 306, and block 308.

These memory blocks can also include shift registers and first-in-first-out (FIFO) buffers.

FPGA 300 further includes digital signal processing (DSP) blocks 310 that can implement, for example, multipliers with add or subtract features. Input/output elements (IOEs) 312 located, in this example, around the periphery of the chip, support numerous single-ended and differential input/output standards. IOEs 312 include input and output buffers that are coupled to pins of the integrated circuit. The pins are external terminals of the FPGA die that can be used to route, for example, input signals, output signals, and supply voltages between the FPGA and one or more external devices. It should be understood that FPGA 300 is described herein for illustrative purposes only and that the present invention can be implemented in many different types of integrated circuits.

Figure 4:
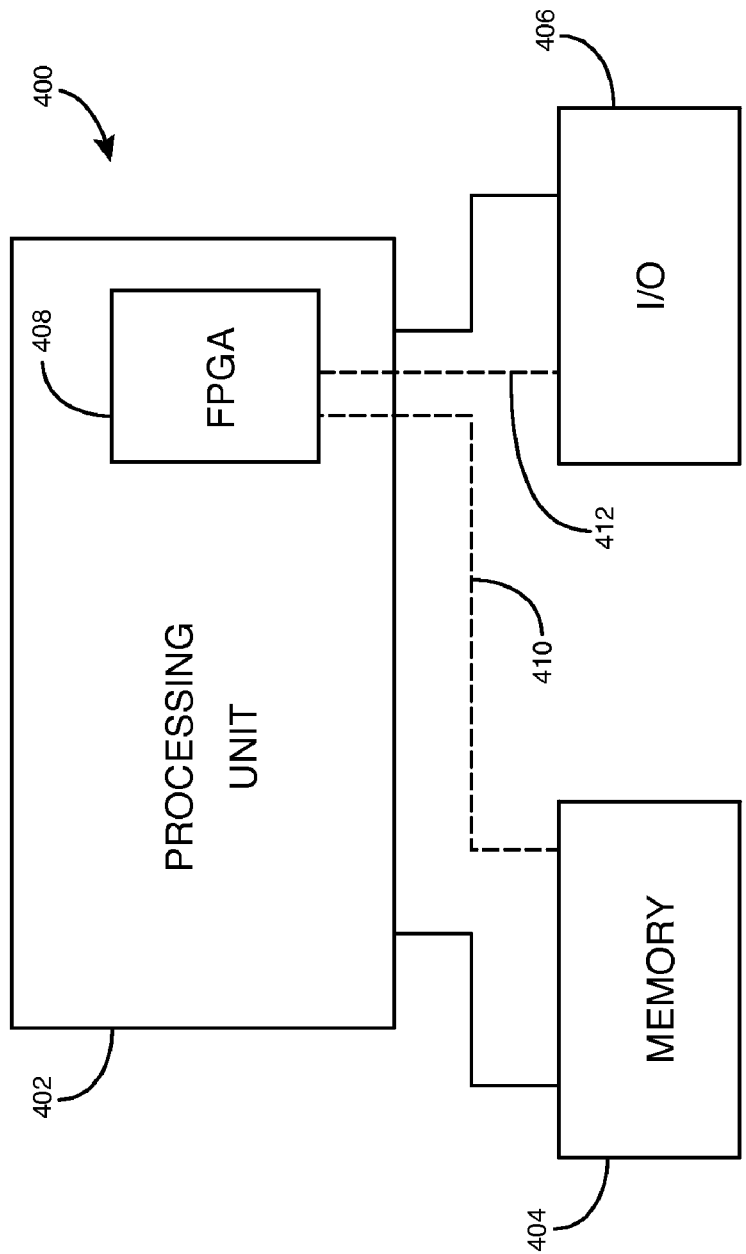
FIG. 4 shows a block diagram of an exemplary digital system that can embody techniques of the present invention.

The present invention can also be implemented in a system that has an FPGA as one of several components. FIG. 4 shows a block diagram of an exemplary digital system 400 that can embody techniques of the present invention. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404, and an input/output (I/O) unit 406 interconnected together by one or more buses. According to this exemplary embodiment, an FPGA 408 is embedded in processing unit 402. FPGA 408 can serve many different purposes within the system of FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404, receive and transmit data via I/O unit 406, or other similar functions. Processing unit 402 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 408 can control the logical operations of the system. As another example, FPGA 408 acts as a reconfigurable processor that can be reprogrammed as needed to handle a particular computing task. Alternatively, FPGA 408 can itself include an embedded microprocessor. Memory unit 404 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   first transistors;
   a first comparator operable to compare a first reference signal and a signal that is based on conductive states of the first transistors to generate an output signal;
   a first control circuit operable to generate first control signals based on the output signal of the first comparator, wherein the conductive states of the first transistors are determined based on the first control signals;
   storage circuits operable to store second control signals based on the first control finals;
   a calibration circuit comprising second transistors, wherein conductive states of the second transistors are determined based on the second control signals, and wherein the calibration circuit is operable to generate third control signals; and
   a buffer operable to control a termination impedance at a first external terminal of the circuit based on the second and the third control signals.

2. The circuit of claim 1 further comprising:
   a multiplier circuit operable to multiply fourth control signals by fifth control signals that are generated based on the third control signals to generate calibration signals, wherein the buffer is operable to control the termination impedance at the first external terminal of the circuit based on the calibration signals.

3. The circuit of claim 1, wherein the calibration circuit further comprises:
   third transistors;
   a second comparator operable to compare a second reference signal and a signal that is based on conductive states of the second and the third transistors to generate an output signal; and
   a second control circuit operable to generate the third control signals based on the output signal of the second comparator, wherein the conductive states of the third transistors are determined based on the third control signals.

4. The circuit of claim 1 further comprising:
   an arithmetic circuit operable to perform an arithmetic function based on fourth control signals and the second control signals to generate calibration signals,
   wherein the buffer is operable to control the termination impedance at the first external terminal based on the calibration signals.

5. The circuit of claim 4, wherein the arithmetic circuit is a multiplier circuit operable to multiply the fourth control signals by the second control signals to generate the calibration signals.

6. The circuit of claim 1 further comprising:
   a pattern detect circuit operable to generate a pattern detect signal based on the output signal of the first comparator, wherein the storage circuits are operable to store the second control signals based on the first control signals in response to the pattern detect signal.

7. The circuit of claim 1 further comprising:
   first resistors, wherein each of the first resistors is coupled in series with one of the first transistors; and
   second resistors, wherein each of the second resistors is coupled in series with one of the second transistors.

8. The circuit of claim 1 wherein an input of the first comparator is coupled to a second external terminal of the circuit.

9. The circuit of claim 1, wherein the circuit is in a field programmable gate array integrated circuit.

10. A circuit comprising:
a first calibration circuit comprising first transistors, a first comparator operable to compare a first reference signal and a signal generated based on conductive states of the first transistors, a first control circuit operable to generate first control signals based on an output signal of the first comparator, and first storage circuits operable to store second control signals based on the first control signals, wherein the conductive states of the first transistors are controlled based on the first control signals;
a second calibration circuit comprising second transistors, wherein the second calibration circuit is operable to generate third control signals, and wherein conductive states of the second transistors are controlled based on the second control signals; and
a buffer circuit operable to provide a termination impedance at a first pin based on the second and the third control signals.

11. The circuit of claim 10, wherein the second calibration circuit comprises third transistors, a second comparator that is operable to compare a second reference signal and a signal that is based on conductive states of the second and the third transistors, and a second control circuit generating the third control signals based on an output signal of the second comparator, and wherein the conductive states of the third transistors are controlled based on the third control signals.

12. The circuit of claim 11, wherein the buffer circuit comprises registers operable to store calibration signals having values that are based on the second control signals in response to an update signal, and wherein the buffer circuit is operable to provide the termination impedance at the first pin based on the calibration signals.

13. The circuit of claim 10 further comprising:
a multiplier circuit operable to multiply the second control signals by fourth control signals to generate calibration signals, wherein the buffer circuit is operable to provide the termination impedance at the first pin based on the calibration signals.

14. The circuit of claim 10 further comprising:
a first multiplier circuit operable to multiply the second control signals by fourth control signals to generate first calibration signals;
second storage circuits operable to store fifth control signals based on the third control signals; and
a second multiplier circuit operable to multiply the fifth control signals by the fourth control signals to generate second calibration signals, wherein the buffer circuit is operable to provide the termination impedance at the first pin based on the first and the second calibration signals.

15. The circuit of claim 11, wherein the first calibration circuit is coupled to a second pin of the circuit.

16. A method comprising:
comparing a first reference signal and a signal that is based on conductive states of first transistors to generate a first comparison signal;
generating first control signals based on the first comparison signal, wherein the conductive states of the first transistors are determined based on the first control signals;
storing second control signals in storage circuits that are based on the first control signals;
generating third control signals using second transistors in a calibration circuit, wherein conductive states of the second transistors are determined based on the second control signals; and
providing a termination impedance at a first external terminal of a circuit based on the second and the third control signals.

17. The method of claim 16 further comprising:
multiplying the second control signals by fourth control signals to generate first calibration signals, wherein providing a termination impedance at a first external terminal of a circuit based on the second and the third control signals further comprises providing the termination impedance at the first external terminal of the circuit based on the first calibration signals.

18. The method of claim 16 further comprising:
comparing a second reference signal and a signal that is based on conductive states of the second and third transistors to generate a second comparison signal,
wherein the conductive states of the third transistors are determined based on the third control signals, and wherein generating third control signals using second transistors in a calibration circuit comprises generating the third control signals based on the second comparison signal.

19. The method of claim 17 further comprising:
multiplying fifth control signals generated based on the third control signals by the fourth control signals to generate second calibration signals,
wherein providing a termination impedance at a first external terminal of a circuit based on the second and the third control signals further comprises providing the termination impedance at the first external terminal of the circuit based on the first and the second calibration signals.

20. A method comprising:
comparing a first reference signal and a signal that is based on conductive states of first transistors to generate a first comparison signal;
generating first control signals based on the first comparison signal, wherein the conductive states of the first transistors are determined based on the first control signals;
storing second control signals in first storage circuits that are based on the first control signals;
generating third control signals using second and third transistors in a calibration circuit, wherein conductive states of the second transistors are determined based on the second control signals, and wherein conductive states of the third transistors are determined based on the third control signals; and
providing a termination impedance at a first external terminal of a circuit using a buffer based on the second and the third control signals.

21. The method of claim 20 further comprising:
comparing a second reference signal and a signal that is based on conductive states of the second and the third transistors to generate a second comparison signal, wherein generating third control signals using second and third transistors in a calibration circuit comprises generating the third control signals based on the second comparison signal.

* * * * *